(12) United States Patent
Murakami (10) Patent No.: US 8,535,782 B2
(45) Date of Patent: Sep. 17, 2013

(54) RESIN SHEET FOR CIRCUIT BOARD AND PRODUCTION PROCESS THEREFOR

(75) Inventor: Haruo Murakami, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 788 days.

(21) Appl. No.: 12/664,660

(22) PCT Filed: Jul. 1, 2008

(86) PCT No.: PCT/JP2008/001718
§ 371 (c)(1),
(2), (4) Date: Dec. 15, 2009

(87) PCT Pub. No.: WO2009/008131
PCT Pub. Date: Jan. 15, 2009

(65) Prior Publication Data
US 2010/0183849 A1    Jul. 22, 2010

(30) Foreign Application Priority Data
Jul. 9, 2007 (JP) .................. 2007-179639

(51) Int. Cl.
B32B 3/00 (2006.01)
B32B 23/02 (2006.01)

(52) U.S. Cl.
USPC ............. 428/172; 428/192; 428/156

(58) Field of Classification Search
USPC .............. 428/156, 192, 40.1, 41.8, 343, 354, 428/344, 352, 60, 172, 901, 157, 78
See application file for complete search history.

(56) References Cited

U.S. PATENT DOCUMENTS

| 6,114,013 A * | 9/2000 | Hotta ........................ 428/192 |
| 2006/0003088 A1 * | 1/2006 | Kasuga et al. ............... 427/66 |
| 2009/0126974 A1 | 5/2009 | Yuasa et al. |
| 2011/0120630 A1 | 5/2011 | Yuasa et al. |

FOREIGN PATENT DOCUMENTS

| EP | 377332 | 7/1990 |
| JP | 1987-199328 | 12/1987 |
| JP | 02-177596 | 7/1990 |
| JP | 02-206549 | 8/1990 |
| JP | 11-092725 | 4/1999 |
| JP | 2002-113412 | 4/2002 |
| JP | 2006-212549 | 8/2006 |
| WO | WO 2007/040125 | 4/2007 |

OTHER PUBLICATIONS

Japanese Office Action for corresponding JP Application No. 2011-186535, Mar. 5, 2013.

* cited by examiner

*Primary Examiner* — Catherine A Simone
(74) *Attorney, Agent, or Firm* — Ditthavong Mori & Steiner, P.C.

(57) ABSTRACT

A resin sheet (100) is provided with a resin layer (120), and a passivation layer (110) laminated on one surface of the resin layer (120). The resin sheet (100) has a rectangular shape in a plan view. The periphery of the passivation layer (110) extends outward from the periphery of the resin layer (120). The resin layer (120) is provided with a flat section (121), and a slope section (122) wherein the thickness of the resin layer (120) gradually reduces toward the outside from the flat section (121). A difference between the resin thickness (d) of the boundary section (123) between the slope section (122) and the flat section (121) of the resin layer (120), and an average thickness (D) of the flat section (121) is 5% or less of the average thickness (D).

40 Claims, 5 Drawing Sheets

RESIN SHEET FOR CIRCUIT BOARD AND PRODUCTION PROCESS THEREFOR

TECHNICAL FIELD

The present invention relates to a resin sheet for a circuit board and a production process therefor.

BACKGROUND ART

A resin sheet for interlayer adhesion between circuit boards in a multilayer circuit board frequently used in electric devices has a three layer structure of a passivation layer, a resin layer and a release layer, and is generally produced by a continuous process. A product is cut into sheets or wound as rolls with a predetermined length which are then released as commercial products. In a general use, one release sheet is removed, the resin layer is disposed such that it faces the circuit board and these are laminated, and then the passivation layer is removed.

Generally, when a resin material is continuously applied to the passivation layer to form a resin layer, the resin material is sometimes applied in an area narrower than the sheet width of the passivation layer (for example, see Patent Document No. 1). This is because when the resin material is soft and fluid, a pressure applied to the resin layer may make the circumferential resin layer flowing to the edge of the passivation layer and further running out. Therefore, the edges of the passivation layer in a sheet width direction which are left uncoated prevent the resin layer from running out to the surrounding area.

When such running out to the area surrounding the resin layer occurs, the resin tends to be thinner than the other regions. Thus, when the resin sheet is adhered to an adherend, a resin layer having a sufficient thickness for adhesion may not be ensured.

On the other hand, for a resin layer with a less amount of running out such as a so-called hard coat layer, a resin material is applied to an area narrower than the sheet width of the passivation layer, and after the application, both sides are cut and removed by a predetermined size (for example, see Patent Document No. 2). This is because the resin layer applied to the end faces tends to be thicker than the other regions due to difference in surface tension balance of the applied solution on the edges, and thus continuous winding causes raise of the periphery, that is, a "derby hat" phenomenon. Therefore, after application of the resin material, both sides (lugs) of the sheet are cut and removed using, for example, a ring cutter.

However, with the passivation layer and the resin layer having the same width, the equality in width can make it difficult to remove the passivation layer after laminating the adhesion sheet on, for example, a circuit board surface or cause damage to the peripheral resin layer. Such damage can lead to contamination with a part of the broken resin layer as a foreign material, adversely affecting a product yield.

Patent Document No. 1: Japanese published unexamined application No. 1999-092725.

Patent Document No. 2: Japanese published unexamined application No. 2006-212549.

DISCLOSURE OF THE INVENTION

In view of the above problems, an objective of this invention is to provide a resin sheet for a circuit board in which peelability of a protection film (passivation layer) of a resin layer is improved and the resin layer has edges resistant to damage, as well as a production process therefor.

In accordance with the present invention, there is provided a resin sheet for a circuit board comprising a resin layer and a passivation layer laminated on one surface of the resin layer, wherein the resin sheet has a rectangular shape in a plan view and the periphery of the passivation layer extends outward from the periphery of the resin layer; and the resin layer has a flat section and a slope section where the thickness of the resin layer gradually reduces toward the outside from the flat section; and a difference between the resin thickness (d) of the boundary section between the slope section and the flat section of the resin layer and an average thickness (D) of the flat section is 5% or less of the average thickness (D).

This resin sheet has a rectangular shape and in plan view, the periphery of the passivation layer extends outward from the periphery of the resin layer. Thus, there is provided a resin sheet having at least one side uncovered by the resin layer where the side can be used as a clue for easily removing the passivation layer when the passivation layer is removed after laminating the resin layer on, for example, a circuit board. Furthermore, a difference between the resin thickness (d) of the boundary section between the slope section and the flat section of the resin layer and an average thickness (D) of the flat section is 5% or less of the average thickness (D). Thus, there can be provided a resin sheet in which an unwanted force is not applied to the periphery because of non-bulkiness in the periphery when a number of rectangular shape sheets are piled for long-term storage or transportation.

A resin sheet in accordance with the present invention is a long resin sheet for a circuit board having a resin layer and a passivation layer laminated on one surface of the resin layer, wherein in a laminate cross-sectional view in a width direction, at least one edge in the passivation layer extends outward from the edge of the resin layer; the resin layer comprises a flat section and a slope section where the thickness of the resin layer gradually reduces toward the outside of the edge from the flat section; and a difference between the resin thickness (d) of the boundary section between the slope section and the flat section of the resin layer and an average thickness (D) of the flat section is 5% or less of the average thickness (D).

In the long resin sheet, at least one edge of the passivation layer extends outward from the edge of the resin layer. Thus, there can be provided a resin sheet having at least one side uncovered by the resin layer where the edge of the side can be gripped for easily removing the passivation layer when the passivation layer is removed after laminating the resin layer on, for example, a circuit board. Assuming that a resin thickness of the boundary section between the slope section and the flat section in the resin layer is (d) and an average thickness of the flat section is (D), (d)−(D) is 5% or less of (D). Thus, a thickness of the periphery resin layer is not significantly different from that in any other area, so that there is provided a resin sheet in which, when a long resin sheet is, for example, wound around a paper core, a periphery does not become raised and thus no wrinkles are formed.

Assuming that a length of the slope section is (L) and an average thickness of the flat section is (D), (L)÷(D) can be 5 or less. In a conventional application liquid for a general laminate, the value is 10 or more, so that there are a number of areas with an adhesive in the ends being thinner and therefore, when a passivation layer is removed, the adhesive may be transferred to the passivation layer side. In contrast, in accordance with the above aspect, there is provided a resin sheet in which a thickness of the periphery is adequately ensured, so that when a passivation layer is removed, the resin layer is not transferred to the passivation layer and the surrounding area is not contaminated.

In the flat section, adhesiveness of the resin layer to the passivation layer can be higher than in the slope section. Thus, wettability between the passivation layer and an application liquid for forming a resin layer is improved in the slope section. Thus, attraction of the application liquid toward a flat section due to surface tension is prevented, and therefore, there is provided a resin sheet for a circuit board without a raised section.

Furthermore, a parting layer may be disposed between the passivation layer and the resin layer. When such a parting layer is formed, peelability of the passivation layer can be further improved. Although forming a parting layer may reduce wettability of an application liquid for forming a resin layer, the problem of a raised resin layer can be prevented by improving adhesiveness in the slope section as described above.

In the parting layer, a part including an area facing the slope section can be roughened. Thus, adhesiveness between the resin layer and the passivation layer can be improved in the slope section.

The area facing the slope section can have an area where the parting layer is absent. This embodiment can also improve adhesiveness between the resin layer and the passivation layer in the slope section.

The surface of the passivation layer where the resin layer is laminated can be release-treated. Such release-treatment can also improve peelability of the passivation layer.

A part of the surface of the release-treated passivation layer including the area facing the slope section can be roughened. Thus, adhesiveness between the resin layer and the passivation layer in the slope section can be improved.

The area facing the slope section can include an untreated area which is not release-treated. Such an aspect can also improve adhesiveness between the resin layer and the passivation layer in the slope section.

A process for producing a resin sheet in accordance with the present invention is a process for producing a resin sheet for a circuit board comprising a resin layer and a passivation layer laminated on one surface of the resin layer, comprising preparing the passivation layer and forming the resin layer on the one surface of the passivation layer, wherein after the forming the resin layer, at least one edge of the passivation layer in a width direction extends outward from the area where the resin layer is formed.

In accordance with the present invention, there can be provided a resin sheet for a circuit board in which peelability of the protection film (passivation layer) from the resin layer is improved and the resin layer is resistant to damage, as well as a production process therefor.

A process for producing a resin sheet in accordance with the present invention can comprise, as the forming the resin layer, forming a parting layer on the one surface of the passivation layer, roughening a part of the parting layer formed, and forming the resin layer on the roughened parting layer.

A process for producing a resin sheet in accordance with the present invention can comprise, as the forming the resin layer, roughening a part of the one surface of the passivation layer, release-treating the one roughened surface of the passivation layer, and forming the one surface of the release-treated passivation layer.

BEST MODE FOR CARRYING OUT THE INVENTION

There will be detailed preferred embodiments of a resin sheet according to the present invention with reference to the drawings. In the description of the drawings, the identical elements are denoted by the same symbol and repetition of the same description is avoided.

Figure 1:
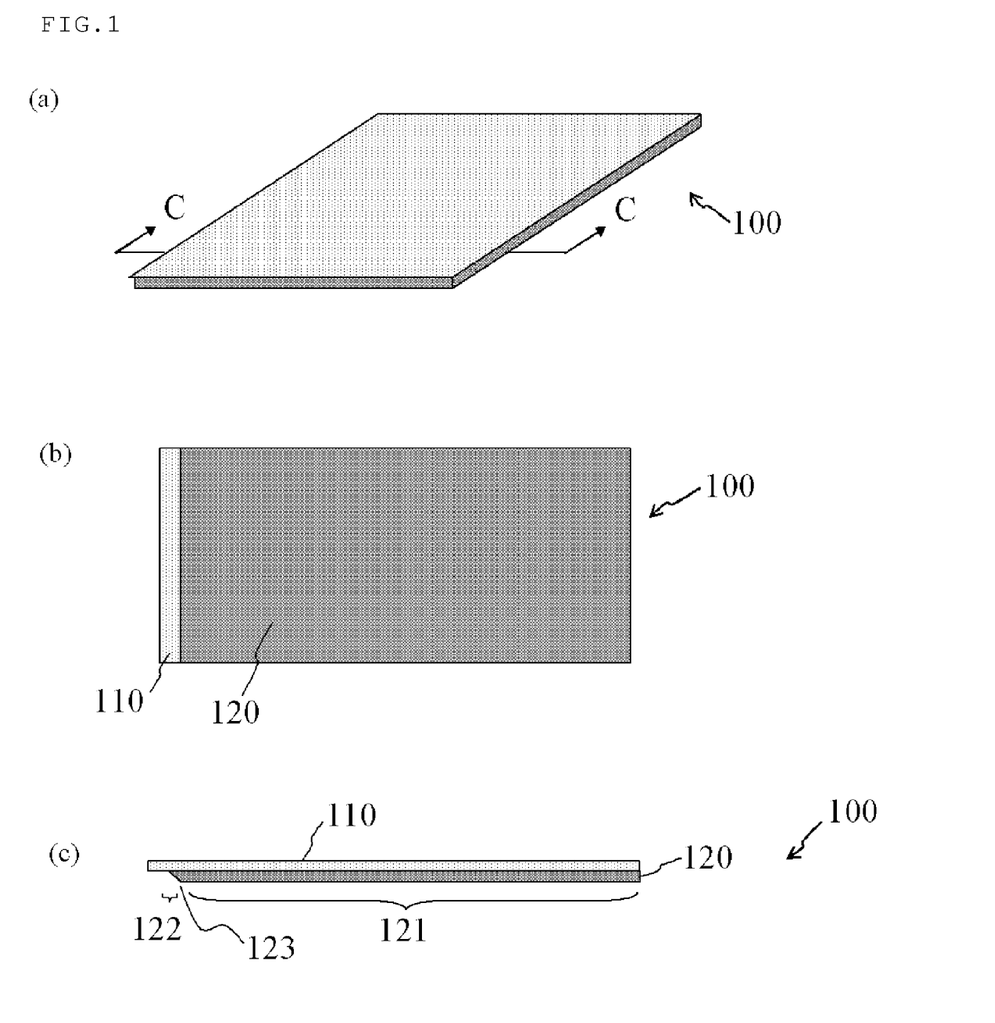
FIG. 1 schematically shows a first embodiment of the present invention, where (a) is a perspective view, (b) is a bottom plan view and (c) is a cross-sectional view taken on line C-C.

FIG. 1 shows the first embodiment of a resin sheet for a circuit board according to the present invention. FIG. 1(a) is a perspective view schematically illustrating a resin sheet 100. FIG. 1(b) is its bottom plan view and FIG. 1(c) is a cross-sectional view of FIG. 1(a) taken on line C-C. As shown in the figure, the resin sheet 100 has a resin layer 120 and a passivation layer 110 laminated on one surface of the resin layer 120. The resin sheet 100 has a rectangular shape and in plan view, the periphery of the passivation layer 110 extends outward from the periphery of the resin layer 120. This figure shows in the left side that the passivation layer 110 extends outward. Thus, there can be provided a resin sheet having at least one side uncovered by the resin layer where the edge of the side can be gripped for easily removing the passivation layer when the passivation layer is removed after laminating the resin layer on, for example, a circuit board.

The resin layer 120 comprises a flat section 121 and a slope section 122 where the thickness of the resin layer gradually reduces toward the outside from the flat section 121. Furthermore, a resin thickness (d) in the boundary section 123 between the slope section 122 and the flat section 121 in the resin layer 120 is +5% or less in relation to an average thickness (D).

As described above, since the thickness of the boundary section 123 is not extremely larger than the average thickness of the resin layer, a periphery does not become raised and thus no wrinkles are formed when a long resin sheet is, for example, wound around a paper core. Furthermore, in terms of a sheet of this embodiment, an unwanted force is not applied to the periphery because of non-bulkiness in the periphery when a number of sheets are piled for long-term storage or transportation. The passivation layer 110 prevents the resin layer 120 formed in the passivation layer 110 from being contaminated after the resin layer 120 is laminated with, for example, a circuit board and plays a role of a substrate when the passivation layer 110 is integrally laminated with the resin layer 120 such as a metal foil and a resin film.

A width of the passivation layer 110 is larger than that of the resin layer 120 preferably, but not limited to, by 1 mm to 100 mm, more preferably by 1 mm to 20 mm. Extension direction can be four sides or only one side. When a resin sheet 100 is continuously formed, extension direction is two sides perpendicular to the longitudinal direction of the sheet in the light of workability. The passivation layer 110 having a width larger than that of the resin layer 120 can result in improved visibility, which contributes to prevention of failure to remove the passivation layer and can act as a tab for gripping during peeling.

The passivation layer 110 can be selected from, but not limited to, metal foils and resin films. Examples of the metal foil include copper foil and aluminum foil. Their surface can be surface-treated such as nickel treatment and anticorrosive treatment. The resin film can be a film made of a plastic resin. Examples of a plastic resin include polyester, polyolefin, polyphenylene sulfide, polyvinyl chloride, polytetrafluoroethylene, polyvinylidene fluoride, polyvinyl fluoride, polyvinyl alcohol, polycarbonate, polyimide and polyether ether ketone.

A thickness of the passivation layer 110 is preferably, but not limited to, 15 μm to 200 μm.

A thickness of the resin layer 120 is preferably, but not limited to, within the range of 5 μm to 200 μm. A thickness of the resin layer 120 refers to a thickness of the flat section 121.

In the resin sheet 100 of this embodiment, it is more preferable that a difference between a resin thickness (d) of the boundary section 123 and an average thickness (D) of the flat section 121 is 3 μm or less.

A thickness of the boundary section 123 or the flat section 121 can be measured by a commercially available contact or noncontact measuring device (indicator). Alternatively, the thickness can be determined by image processing of a laminate cross section.

A resin material constituting the resin layer 120 can be an epoxy resin. Preferably, such an epoxy resin is substantially halogen-free without limitation. Examples of the epoxy resin include bisphenol type epoxy resins such as bisphenol-A epoxy resin, bisphenol-F epoxy resin, bisphenol-E type epoxy resin, bisphenol-S type epoxy resin, bisphenol-Z type epoxy resin (4,4'-cyclohexydienebisphenol type epoxy resin), bisphenol-P type epoxy resin (4,4'-(1,4-phenylenediisoprediene)bisphenol type epoxy resin) and bisphenol-M type epoxy resin (4,4'-(1,3-phenylenediisoprediene)bisphenol type epoxy resin); novolac type epoxy resins such as phenol novolac type epoxy resin and cresol novolac epoxy resin; arylalkylene type epoxy resins such as biphenyl type epoxy resin, xylylene type epoxy resin and biphenylaralkyl type epoxy resin; naphthalene type epoxy resins; anthracene type epoxy resins; phenoxy type epoxy resins; dicyclopentadiene type epoxy resins; norbornene type epoxy resins; adamantane type epoxy resins; and fluorene type epoxy resins. One of these can be used alone, two or more having different weight-average molecular weights can be combined, or alternatively one or more of these and their prepolymers can be combined.

Furthermore, a cyanate resin can be contained as a resin material. The cyanate resin can be prepared, for example, by reacting a cyanogen halide with a phenol compound and, if necessary, treating (for example, heating) the product to form a prepolymer. Specific examples include novolac type cyanate resins and bisphenol type cyanate resins such as bisphenol-A type cyanate resin, bisphenol-E type cyanate resin and tetramethylbisphenol-F type cyanate resin.

The resin material can further contain, as an inorganic filler, at least one selected from silica, aluminum hydroxide and talc.

Further additives can be appropriately, if necessary, added, including a curing agent, a hardening accelerator, a thermoplastic resin, an organic filler and a coupling agent. The resin layer 120 of this embodiment can be formed by applying an application liquid prepared by dissolving and/or dispersing the above components in an organic solvent on one surface of the passivation layer 110 and drying it by heating.

In forming the resin layer 120, the application liquid applied aggregates depending on balance in a surface tension of the application liquid and wettability of a base layer (passivation layer 110). Aggregation of the application liquid is insignificant in the center of the applied surface because of force balance but significant in the outer edge of the applied surface. That is, the application liquid of the resin material applied on the passivation layer 110 aggregates in the inside area along the periphery of the passivation layer 110.

Figure 2:
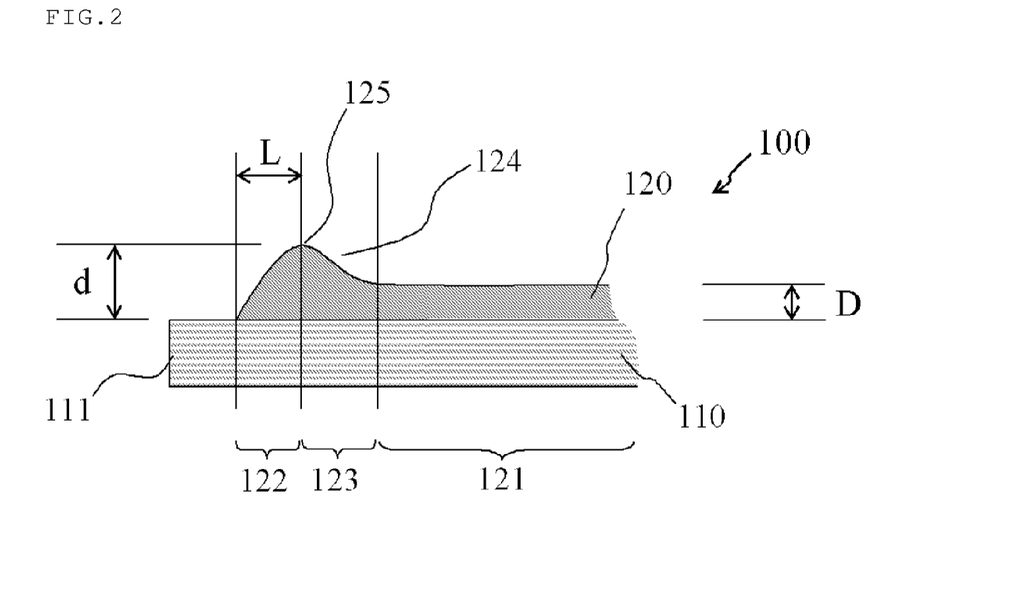
FIG. 2 is a laminate cross-sectional view schematically illustrating an area around the periphery of a resin sheet.

FIG. 2 is a laminate cross-sectional view schematically illustrating the area around the periphery of the resin sheet 100. In this figure, the vertical direction is inverse in relation to that of FIG. 1(c).

The resin layer 120 laminated on the upper surface of the passivation layer 110 has a bank 124 along the periphery 111 of the passivation layer 110. The top 125 of the bank 124 is a ridge extending in a direction vertical to the paper.

The resin layer 120 has a slope section 122 whose thickness gradually reduces outward from the top 125. The resin layer 120 further has a flat section 121 whose thickness is constant inward (rightward in the figure) from the top 125. Furthermore, a boundary section 123 is formed between the slope section 122 and the flat section 121.

The resin thickness (d) of the boundary section 123 is identical to the maximum thickness of the slope section 122. In this embodiment, the resin thickness (d) of the boundary section 123 means the maximum thickness of the boundary section 123.

In the resin sheet 100 of this embodiment, the resin thickness (d) of the boundary section 123 is +5% or less of the average thickness (D) of the flat section 121.

In the resin sheet 100 of this embodiment, (L)÷(D) is preferably 5 or less, more preferably 2 or less, assuming that a length of the slope section 122 is (L) and an average thickness of the flat section 121 is (D). Thus, there can be provided the resin sheet 100 in which a thickness of the periphery of the resin layer 120 is adequately ensured, so that when the passivation layer 110 is removed, the resin layer 120 is not transferred to the passivation layer 110 and the surrounding area is not contaminated.

Figure 3:
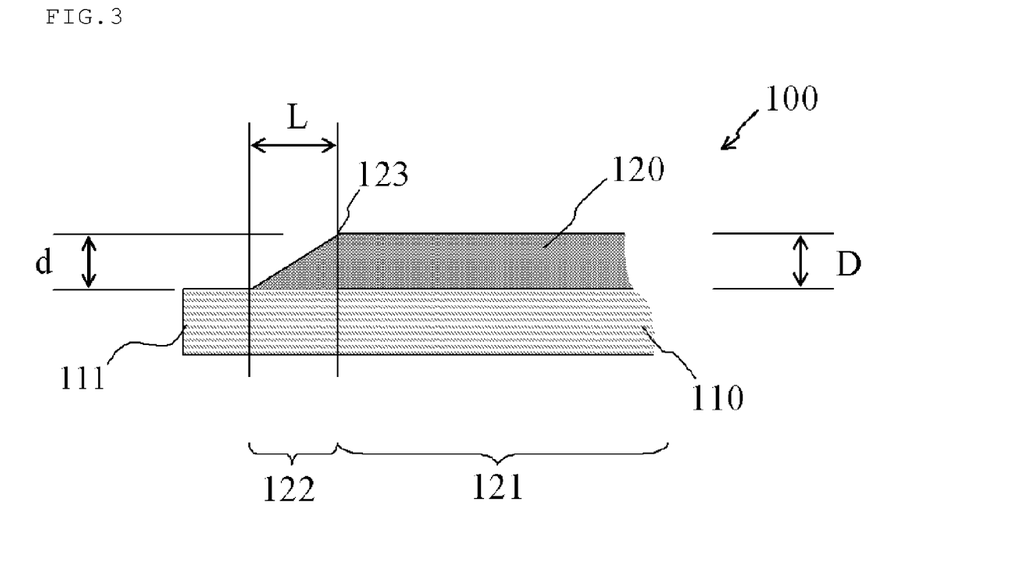
FIG. 3 is a laminate cross-sectional view schematically illustrating another form of an area around the periphery of a resin sheet.

FIG. 3 is a laminate cross-sectional view schematically illustrating another form of an area around the periphery of the resin sheet 100.

The resin layer 120 shown in this figure does not have a top, and the slope section 122 is continuously formed from the edge of the flat section 121. Here, the boundary section 123 as a border between the flat section 121 and the slope section 122 does not have any length. The resin thickness (d) of the boundary section 123 is, therefore, the average thickness (D) of the flat section 121.

Figure 4:
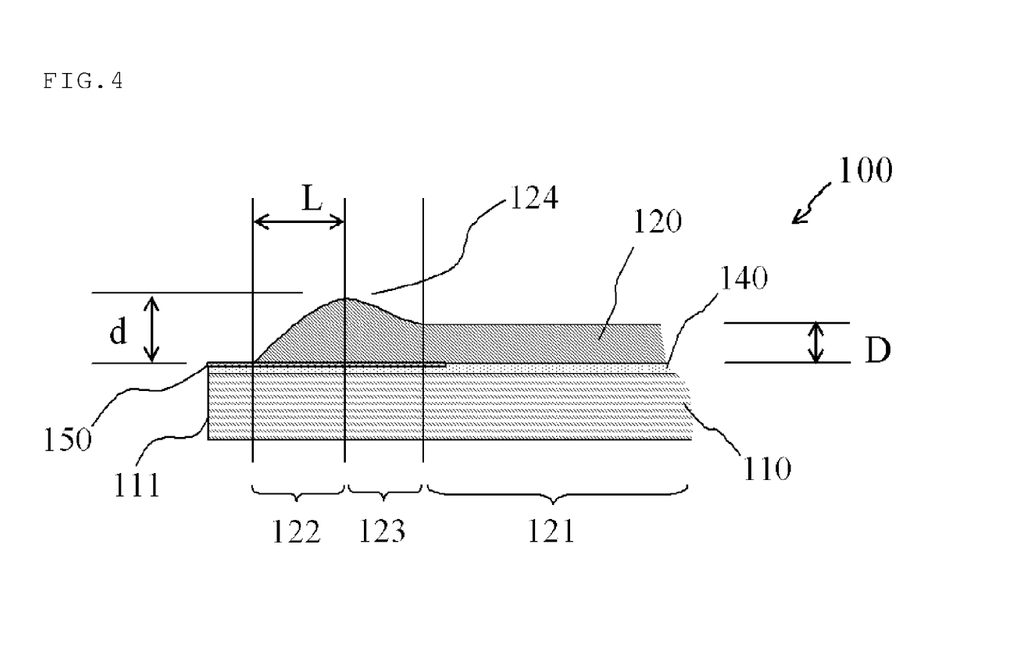
FIG. 4 is a laminate cross-sectional view schematically illustrating a resin sheet of a second embodiment.

FIG. 4 is a laminate cross-sectional view schematically illustrating the resin sheet 100 of a second embodiment.

The resin sheet 100 of this embodiment has a parting layer 140 between the passivation layer 110 and the resin layer 120.

The parting layer 140 can be formed in a predetermined thickness by applying a parting agent such as an olefinic resin compound, a fluororesin compound or a silicone resin. Examples of the olefinic resin compound include polyolefinic compounds such as polypropylene and polyethylene. The polyolefinic compound can have a functional group such as carboxyl, amino, alcoholic hydroxide and isocyanate.

In the parting layer 140 of this embodiment, a part including an area facing the slope section 122 can be roughened. The roughening can be conducted by polishing or blasting. The bonding surface with the resin layer 120 is roughened.

There are no particular restrictions to the part to be roughened as long as it contains at least part of the area facing the slope section 122.

In this embodiment, the roughened area 150 is formed from the periphery 111 of the passivation layer 110 to the inside in a length including the slope section 122 and the boundary section 123.

Here, in the edge of the periphery 111, there can remain an area where the roughened area 150 is not formed.

Forming the roughened area 150 in the parting layer 140 can increase adhesiveness between the resin layer 120 and the passivation layer 110 in the slope section 122 in comparison with the flat section 121.

Thus, wettability of the roughened area 150 with the application liquid to form the resin layer 120 is improved and aggregation due to a surface tension is prevented. Thus, the application liquid extends toward the periphery 111 of the passivation layer, and therefore, the resin layer 120 formed by heating/drying the liquid has a gentle slope section 122. Therefore, in the resin sheet 100 of this embodiment, a height of the bank, that is, a resin height (d) of the boundary section 123 is reduced.

The roughened area 150 of this embodiment is formed, containing the periphery 111 of the passivation layer 110. Thus, aggregation of the application liquid is well balanced with adhesion force to the roughened area 150 to form a band-like extension area along the periphery 111 of the passivation layer 110.

This embodiment can be modified in various forms.

For example, an area without the parting layer 140 can be formed in an area facing the slope section 122.

The parting layer 140 improves peelability of the passivation layer 110 from the resin layer 120 whereas reducing wettability of the resin layer 120 with the application liquid, and therefore, the parting layer 140 can be absent in the part as a base layer of the slope section 122 to maintain wettability in the part.

As another variation, in the passivation layer 110, the surface (laminate surface) where the resin layer 120 is laminated can be release-treated.

Examples of release treatment include treatment with a long-chain alkyl and surface treatment with a silylation agent or a fluorine-containing gas.

In the laminate surface of the release-treated passivation layer 110, a part including an area facing the slope section 122 is roughened.

The laminate surface of the passivation layer 110 can be roughened after release treatment, or alternatively, the laminate surface of the passivation layer 110 can be roughened before release treatment.

An untreated area which is not release-treated can be formed in the area facing the slope section 122. Without being release-treated, wettability can be maintained in the part as a base layer of the slope section 122.

Figure 5:
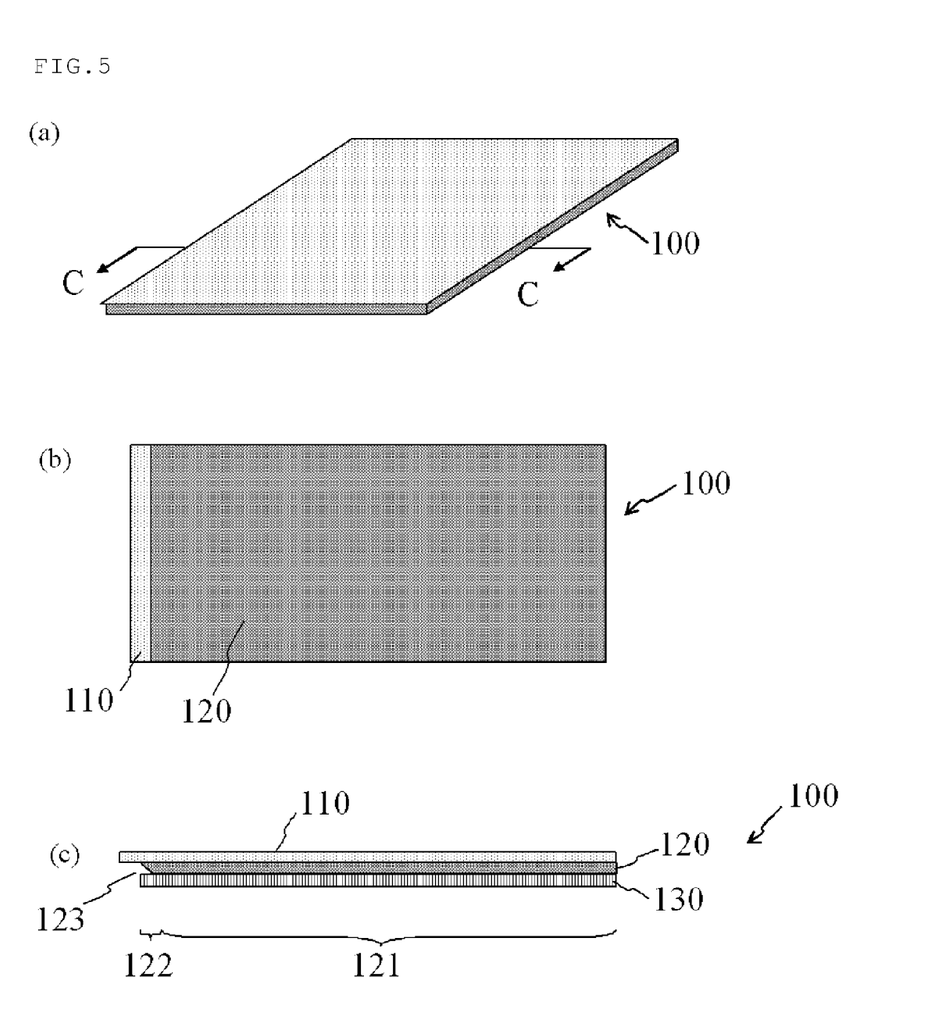
FIG. 5 schematically shows a third embodiment, where (a) is a perspective view, (b) is a bottom plan view and (c) is a cross-sectional view taken on line C-C.

FIG. 5 schematically shows the resin sheet 100 according to a third embodiment. FIG. 5(a) is a perspective view, FIG. 5(b) is a bottom plan view, and FIG. 5(c) is a cross-sectional view taken on line C-C.

In the resin sheet 100 of this embodiment, the passivation layer 110 is laminated on one surface of the resin layer 120 while the release layer 130 is laminated on the other surface. The resin layer 120 has the flat section 121 and the slope section 122 where the thickness of the resin layer gradually reduces toward the outside from the flat section 121. Such a laminate structure of the resin layer 120 on both surfaces can prevent the resin layer 120 from being contaminated until just before lamination on a circuit board. Although in this embodiment, the release layer 130 has the substantially same width as that of the resin layer 120 as shown FIG. 5(c), at least one periphery of the release layer 130 can extend outward from the periphery of the resin layer 120 as is in the passivation layer 110. Thus, when the release layer 130 is removed, the protruded part can more advantageously act as a clue for peeling, resulting in improvement of workability during lamination with a circuit board.

Figure 6:
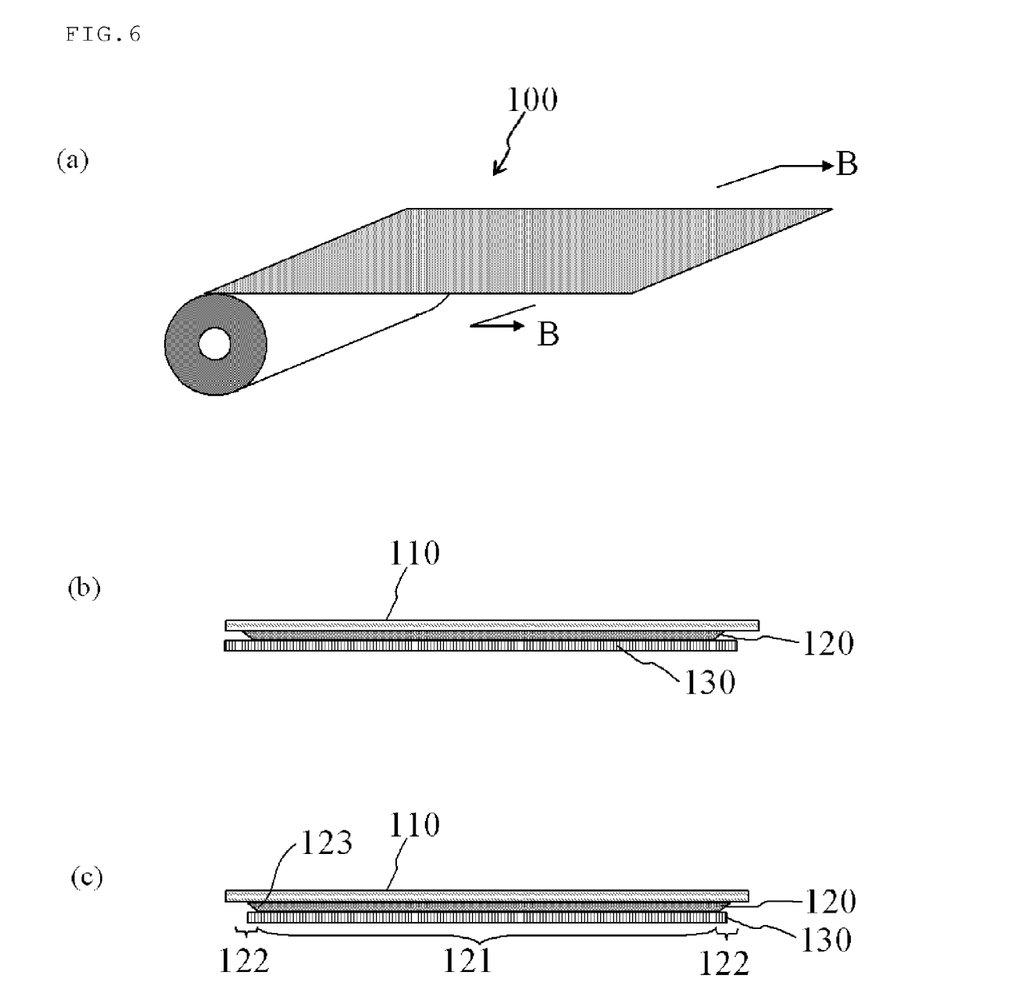
FIG. 6 schematically shows a fourth embodiment, where (a) is a perspective view, (b) is a cross-sectional view taken on line B-B and (c) is a cross-sectional view of its modification.

FIG. 6 schematically shows the resin sheet 100 according to a fourth embodiment. FIG. 6(a) is a perspective view and FIG. 6(b) is a cross-sectional view taken on line B-B illustrating the laminate structure of the resin sheet 100. FIG. 6(c) is a cross-sectional view illustrating a variation of this embodiment.

As shown in FIGS. 6(a) and (b), the resin sheet 100 is the long resin sheet 100 for a circuit board having the resin layer 120 and the passivation layer 110 which is laminated on one surface of the resin layer 120. In the resin sheet 100, at least one edge of the passivation layer 110 extends outward from the edge of the resin layer 120 in a laminate cross-sectional view (cross-sectional view taken on line B-B) in a width direction. Thus, there is at least one side uncovered by the resin layer 120 when the passivation layer 110 is removed after laminating the resin layer 120 on, for example, a circuit board. There can be, therefore, provided a resin sheet where the side can be gripped while the passivation layer 110 can be easily removed. A resin thickness of the boundary section 123 between the slope section 122 and the flat section 121 of the resin layer 120 is preferably +5% or less of an average thickness. Thus, a thickness of the periphery is not significantly different from that in the other areas of the resin layer, so that there is provided a resin sheet in which, when a long resin sheet is, for example, wound around a paper core, a periphery does not become raised and thus no wrinkles are formed.

There are no particular restrictions to positional relationship between the peripheries of the release layer 130 and the resin layer 120. The peripheries of the release layer 130 and the resin layer 120 can be completely superposed at least in one side as shown in FIG. 6(b), or the peripheries can be separate from each other in both sides in a width direction as shown in FIG. 6(c).

A width of the passivation layer 110 is larger than that of the resin layer 120 preferably by 1 mm to 100 mm, more preferably by 1 mm to 20 mm. Extension direction can be only one side or both sides. When a resin sheet 100 is continuously formed, extension direction is two sides perpendicular to the longitudinal direction of the sheet in the light of workability. The passivation layer 110 having a width larger than that of the resin layer 120 can result in improved visibility, which contributes to prevention of failure to remove the passivation layer and can act as a tab for gripping during peeling.

The passivation layer 110 can be selected from, but not limited to, metal foils and resin films. Examples of the metal foil include copper foil and aluminum foil. Their surface can be surface-treated such as nickel treatment and anticorrosive treatment. The resin film can be a film made of a plastic resin. Examples of a plastic resin include polyester, polyolefin, polyphenylene sulfide, polyvinyl chloride, polytetrafluoroethylene, polyvinylidene fluoride, polyvinyl fluoride, polyvinyl alcohol, polycarbonate, polyimide and polyether ether ketone.

A thickness of the passivation layer 110 is preferably, but not limited to, 15 µm to 200 µm.

A thickness of the resin layer 120 is preferably, but not limited to, within the range of 5 µm to 200 µm. A resin material constituting the resin layer 120 can be an epoxy resin. Preferably, such an epoxy resin is substantially halogen-free without limitation. Examples of the epoxy resin include bisphenol type epoxy resins such as bisphenol-A epoxy resin, bisphenol-F epoxy resin, bisphenol-E type epoxy resin, bisphenol-S type epoxy resin, bisphenol-Z type epoxy resin (4,4'-cyclohexydienebisphenol type epoxy resin), bisphenol-P type epoxy resin (4,4'-(1,4-phenylenediisoprediene)bisphenol type epoxy resin) and bisphenol-M type epoxy resin (4,4'-(1,3-phenylenediisoprediene)bisphenol type epoxy resin); novolac type epoxy resins such as phenol novolac type epoxy resin and cresol novolac epoxy resin; arylalkylene type epoxy resins such as biphenyl type epoxy resin, xylylene type epoxy resin and biphenylaralkyl type epoxy resin; naphthalene type epoxy resins; anthracene type epoxy resins; phenoxy type epoxy resins; dicyclopentadiene type epoxy resins; norbornene type epoxy resins; adamantane type epoxy resins; and fluorene type epoxy resins. One of these can be used alone, two or more having different weight-average molecular weights can be combined, or alternatively one or more of these epoxy resin materials and their prepolymers can be combined.

Furthermore, a cyanate resin can be contained as a resin material. The cyanate resin can be prepared, for example, by reacting a cyanogen halide with a phenol compound and, if necessary, treating (for example, heating) the product to form a prepolymer. Specific examples include novolac type cyanate resins and bisphenol type cyanate resins such as bisphenol-A type cyanate resin, bisphenol-E type cyanate resin and tetramethylbisphenol-F type cyanate resin.

The resin material can further contain, as an inorganic filler, at least one selected from silica, aluminum hydroxide and talc.

Further additives can be appropriately, if necessary, added, including a curing agent, a hardening accelerator, a thermoplastic resin, an organic filler and a coupling agent. The resin layer 120 used in the present invention can be formed by applying an application liquid prepared by dissolving and/or dispersing the above components in an organic solvent on one surface of the passivation layer 110.

There will be described a process for producing the resin sheet 100.

The production process for the resin sheet 100 is a process for producing the resin sheet for a circuit board having the resin layer 120 and the passivation layer 110 laminated on one surface of the resin layer 120, containing preparing the passivation layer 110 and forming the resin layer 120 on the one surface (laminate surface) of the passivation layer 110.

Furthermore, in the production process of this embodiment, after forming the resin layer 120, at least one edge of the passivation layer 110 in a width direction extends outward from the area where the resin layer is formed and the edge of the passivation layer 110 remains.

The resin layer 120 can be formed over the passivation layer 110 by an application method using, for example, any of various application devices such as a comma coater and a knife coater or any of various spraying devices such as a spray nozzle. Among these, it is preferable to apply a curable resin varnish over the film using any of various application devices. Here, application is conducted such that a part as a tab for gripping. Optionally, an excessive width of the film after application can be slitted.

Subsequently, the release layer 130 is bonded to the other surface of the resin layer 120 to prepare the resin sheet 100. Then, if necessary, the product can be dried at an ambient temperature or under heating, to substantially remove an organic solvent or a dispersion medium used for preparing the varnish so that the surface of the resin layer can be made less tacky to give a resin sheet exhibiting good handling properties.

The resin sheet 100 can, for example, have resin film in both sides and after laminating the resin layer 120 on a circuit board, can be used as a so-called RCC (Resin Coated Copper) in which both passivation layer 110 and release layer 130 are removed and which has an interlayer adhesive and a metal foil as the passivation layer 110.

The production process of this embodiment can be modified in various forms. For example, when the resin sheet 100 in accordance with the second embodiment shown in FIG. 4 is prepared, the process preferably contains forming parting layer 140 on one surface (laminate surface) of the passivation layer 110, roughening a part in the parting layer 140 thus formed, and forming the resin layer 120 on the parting layer 140 thus roughened.

When the passivation layer 110 is release-treated, the process preferably contains roughening a part of one surface (laminate surface) of the passivation layer 110, release-treating the laminate surface of the passivation layer 110 thus roughened, and forming the resin layer 120 on the laminate surface of the passivation layer 110 thus release-treated.

EXAMPLES

The present invention will be described by, but not limited to, Examples and Comparative Examples.

Example 1

1. Preparation of a Curable Resin Varnish

An insulating resin varnish was prepared by dissolving 15 parts by weight of a novolac type cyanate resin (Lonza Japan Ltd., Primaset PT-30, weight-average molecular weight: about 2600), 8 parts by weight of a biphenyldimethylene type epoxy resin (Nippon Kayaku Co., Ltd., NC-3000P, epoxy equivalent: 275) as an epoxy resin, 7 parts by weight of a biphenyldimethylene type phenol resin (Meiwa Plastic Industries Ltd., MEF-7851-S, hydroxyl equivalent: 203) as a phenol resin and 0.2 parts by weight of an epoxysilane type coupling agent (Nippon Unicar Company Ltd., A-187) as a coupling agent in methyl ethyl ketone at an ambient temperature, adding 20 parts by weight of spherical fused silica SFP-10X (Denki Kagaku Kogyo Kabushiki Kaisha, average particle size: 0.3 µm;) and 49.8 parts by weight of spherical fused silica SO-32R (Admatechs Co., Ltd., average particle size: 1.5 µm) as inorganic fillers, and then stirring the mixture for 10 min using a high-speed stirrer to prepare a curable resin varnish.

2. Preparation of a Resin Sheet With a Film

On a polyethylene terephthalate (PET) film (Mitsubishi Polyester Film Co., Ltd., SFB-38, thickness: 38 µm) as a film was continuously applied the above curable resin varnish using a comma coater. On the PET film with a width of 250 mm was applied the curable resin varnish with a width of 200 mm, which was then dried in an oven at 170° C. for 3 min, to give a film with an average resin thickness of the flat section D=40 µm, a resin height of the boundary section d=42 µm, a slope section length L=40 µm and L/D=1. To the film was then laminated a polyethylene film (Tamapoly Co., Ltd., thickness: 28 µm), to give a resin sheet with a film in which the film width is larger than that of the curable resin sheet.

The sheet was cut into 250 mm length pieces in the application direction to prepare a resin sheet. Furthermore, the above process for producing a resin sheet with a film was conducted to provide a long-roll resin sheet without being cut.

A resin height of the boundary section d and an average resin thickness D were measured by a commercial contact measuring device (Mitutoyo Corporation, ID-C Digimatic Indicator, Code No. 543). A minimum measurement unit of the measuring device was 1 µm.

A resin height of the boundary section d was measured using a blue laser microscope VL 2000D (Lasertec Corporation). A minimum measurement unit of the measuring device is 0.001 µm. A resin height of the boundary section d was determined by scanning it from 0 to 500 µm from the edge of the application width and taking the maximum value.

An average resin thickness D determined by measuring a thickness at 10 mm, 20 mm and 50 mm from the edge of the application width and calculating an average of the values.

3. Removal of the Film

First, after the polyethylene film was removed, then on both surface of a core substrate with a circuit were laminated the above curable resin sheets with a film using a vacuum and pressure laminator (Meiki Co., Ltd., MVLP-500/600IIA). For a long roll, while the polyethylene film was wound up by a separate roll, the sheet was automatically cut into 250 mm length pieces using an auto-cutter, and the resin sheet thus obtained was laminated using the vacuum and pressure laminator. The process was conducted under the conditions of 100° C. and 1 MPa in a vacuum lamination zone and 100° C. and 1.0 MPa in heat/press zone. After pressing, the polyethylene terephthalate film was removed.

Example 2

A process was conducted as described in Example 1, except that a resin sheet with a film was prepared by polishing the surface of the polyethylene terephthalate film as a passivation layer on which a resin layer was to be formed by a No. 1000 buffing roll. As a result, there was provided a film with an average resin thickness of the flat section D=40 µm, a resin height of a boundary section d=37 µm, a slope section length L=20 µm and L/D=0.5.

Comparative Example 1

1. Preparation of a Curable Resin Varnish

An insulating resin varnish was prepared by dissolving 20 parts by weight of a biphenyldimethylene type epoxy resin (Nippon Kayaku Co., Ltd., NC-3000P, epoxy equivalent: 275) as an epoxy resin, 10 parts by weight of a biphenyldimethylene type phenol resin (Meiwa Plastic Industries Ltd., MEF-7851-S, hydroxyl equivalent: 203) as a phenol resin and 0.2 parts by weight of an epoxysilane type coupling agent (Nippon Unicar Company Ltd., A-187) as a coupling agent in methyl ethyl ketone at an ambient temperature, adding 20 parts by weight of spherical fused silica SFP-10X (Denki Kagaku Kogyo Kabushiki Kaisha, average particle size: 0.3 µm;) and 49.8 parts by weight of spherical fused silica SO-32R (Admatechs Co., Ltd., average particle size: 1.5 µm) as inorganic fillers, and then stirring the mixture for 10 min using a high-speed stirrer to prepare a curable resin varnish.

2. Preparation of a Resin Sheet With a Film

On a polyethylene terephthalate (PET) film (Mitsubishi Polyester Film Co., Ltd., SFB-38, thickness: 38 µm) as a film was continuously applied the above curable resin varnish using a comma coater. On the PET film with a width of 250 mm was applied the curable resin varnish with a width of 200 mm, which was then dried in an oven at 170° C. for 3 min, to give a film with an average resin thickness of the flat section D=40 µm, a resin height of the edge d=48 µm, a slope section length L=400 µm and L/D=10. To the film was then laminated a polyethylene film (Tamapoly Co., Ltd., thickness: 28 µm), to give a resin sheet with a film in which the film width is larger than that of the curable resin sheet. The sheet was cut into 250 mm length pieces in the application direction to prepare a resin sheet.

Furthermore, the above process for producing a resin sheet with a film was conducted to provide a long-roll resin sheet without being cut.

A resin height of the edge d and an average resin thickness of the center D were determined as described in the above example.

3. Removal of the Film

The film was removed as described in Example 1.

Comparative Example 2

1. Preparation of a Curable Resin Varnish

A varnish was prepared as described in Comparative Example 1.

2. Preparation of a Resin Sheet With a Film

The process to the bonding of the polyethylene film was conducted as described in Comparative Example 1. Then, the product was slitted with a width of 180 mm which is narrower than the width of the curable resin sheet, 200 mm, to prepare a resin sheet in which the polyethylene terephthalate film, the curable resin sheet and the polyethylene film had an equal width. The resulting resin sheet was cut into 250 mm length pieces in the application direction to prepare a resin sheet.

Furthermore, the above process for producing a resin sheet with a film was conducted to provide a long-roll resin sheet without being cut.

3. Removal of the Film

The film was removed as described in Example 1.

Removal of a Passivation Layer From a Resin Sheet

In the resin sheet of Example 1 or 2 in which the passivation layer was wider than the resin layer, the process of removing the polyethylene terephthalate film after vacuum lamination took about 500 sec per 100 sheets, while in the resin sheet of Comparative Example 2 in which the resin layer and the passivation layer had an equal width, the removal process took about 1500 sec. In Examples 1 and 2, damage to the product by the removal process was not observed, whereas in Comparative Example, damage was observed in 80 of 100 sheets due to scratching an end during removal. Scattering of resin fragments generated by the damage was observed.

Removal of a Release Layer From a Resin Sheet

When the polyethylene film as a release layer was removed from the sheet resin and the long sheet resin in Examples, resin transfer to the release layer was not observed. In contrast, in Comparative Example 1, an L/D in the edge was 10 and transfer was observed a product in which a part of the area with the resin layer being thinner was not continuous.

Edge of the Sheet Resin

When 10 pieces of the resin sheets obtained in Comparative Example 1 were laminated using a vacuum laminator, resin flow from the side where a resin thickness of the edge of the periphery was large was increased. It may lead to make an alignment mark needed for many circuit board processing invisible. In the resin sheets prepared in Examples, such phenomenon did not occur.

Edge of the Long Sheet Resin

In the long sheet resins of Examples, cracks or wrinkles in the resin due to raise of the edge were not observed. In Comparative Example 1, a resin height of the edge (d) is larger, and thus the edge was gradually raised and as a result, a bump from the edge to about 10 mm inside was formed. Thus, the edge of the resin sheet was folded in the bump and resin cracks were observed in some parts. Furthermore, since the passivation layer was longer than the resin layer, the bump in the resin edge caused a wavy and curly wrinkle in the passivation layer.

These results demonstrate that the present invention can provide a resin sheet in which a production efficiency and visibility can be improved and damage in a curable resin sheet and contamination due to break fragments can be avoided during removing a film and which has a resin layer resistant to damage in an edge.

The invention claimed is:

1. A resin sheet for a circuit board comprising a resin layer and a passivation layer laminated on one surface of said resin layer,
    wherein said resin sheet has a rectangular shape in a plan view and the periphery of said passivation layer extends outward from the periphery of said resin layer;
    said resin layer comprises a flat section and a bank positioned outside of the flat section;
    the thickness of the top of said bank is larger than the thickness of the flat section and said bank has a slope section where the thickness of said resin layer gradually reduces toward the outside from the top of said bank;
    a difference between the resin thickness (d) of the top of said bank and an average thickness (D) of said flat section is 5% or less of said average thickness (D); and
    said resin layer contains an epoxy resin.

2. The resin sheet for a circuit board as claimed in claim 1, wherein relationship between a length of said slope section (L) and said average thickness of said flat section (D) is represented by $L \div D \leq 5$.

3. The resin sheet for a circuit board as claimed in claim 1, wherein adhesiveness of said resin layer to said passivation layer is higher in said flat section than in said slope section.

4. The resin sheet for a circuit board as claimed in claim 3, wherein a parting layer is disposed between said passivation layer and said resin layer.

5. The resin sheet for a circuit board as claimed in claim 4, wherein a part including an area facing said slope section in said parting layer is roughened.

6. The resin sheet for a circuit board as claimed in claim 4, wherein an area facing said slope section have an area where said parting layer is absent.

7. The resin sheet for a circuit board as claimed in claim 3, wherein the surface of said passivation layer where said resin layer is laminated is release-treated.

8. The resin sheet for a circuit board as claimed in claim 7, wherein a part of said surface of said release-treated passivation layer including an area facing said slope section is roughened.

9. The resin sheet for a circuit board as claimed in claim 7, wherein an area facing said slope section includes an untreated area which is not release-treated.

10. The resin sheet for a circuit board as claimed in claim 1, wherein a release layer is laminated on the other surface of said resin layer.

11. The resin sheet for a circuit board as claimed in claim 1, wherein said resin layer contains an inorganic filler.

12. A long resin sheet for a circuit board comprising a resin layer and a passivation layer laminated on one surface of said resin layer,
    wherein in a laminate cross-sectional view in a width direction, at least one edge in said passivation layer extends outward from the edge of said resin layer;
    said resin layer comprises a flat section and a bank positioned outside of the flat section;
    the thickness of the top of said bank is larger than the thickness of the flat section and said bank has a slope section where the thickness of said resin layer gradually reduces toward the outside of the edge from the top of said bank;
    a difference between the resin thickness (d) of the top of said bank and an average thickness (D) of said flat section is 5% or less of said average thickness (D); and
    said resin layer contains an epoxy resin.

13. The resin sheet for a circuit board as claimed in claim 12, wherein relationship between a length of said slope section (L) and said average thickness of said flat section (D) is represented by $L \div D \leq 5$.

14. The resin sheet for a circuit board as claimed in claim 12, wherein adhesiveness of said resin layer to said passivation layer is higher in said flat section than in said slope section.

15. The resin sheet for a circuit board as claimed in claim 14, wherein a parting layer is disposed between said passivation layer and said resin layer.

16. The resin sheet for a circuit board as claimed in claim 15, wherein a part including an area facing said slope section in said parting layer is roughened.

17. The resin sheet for a circuit board as claimed in claim 15, wherein an area facing said slope section have an area where said parting layer is absent.

18. The resin sheet for a circuit board as claimed in claim 14, wherein the surface of said passivation layer where said resin layer is laminated is release-treated.

19. The resin sheet for a circuit board as claimed in claim 18, wherein a part of said surface of said release-treated passivation layer including an area facing said slope section is roughened.

20. The resin sheet for a circuit board as claimed in claim 18, wherein an area facing said slope section includes an untreated area which is not release-treated.

21. A resin sheet for a circuit board comprising a resin layer and a passivation layer laminated on one surface of said resin layer,
    wherein said resin sheet has a rectangular shape in a plan view and the periphery of said passivation layer extends outward from the periphery of said resin layer;
    said resin layer comprises a flat section and a bank positioned outside of the flat section;
    the thickness of the top of said bank is larger than the thickness of the flat section and said bank has a slope section where the thickness of said resin layer gradually reduces toward the outside from the top of said bank;
    a difference between the resin thickness (d) of the top of said bank and an average thickness (D) of said flat section is 5% or less of said average thickness (D) ; and
    said resin layer contains a cyanate resin.

22. The resin sheet for a circuit board as claimed in claim 21, wherein relationship between a length of said slope section (L) and said average thickness of said flat section (D) is represented by $L \div D \leq 5$.

23. The resin sheet for a circuit board as claimed in claim 21, wherein adhesiveness of said resin layer to said passivation layer is higher in said flat section than in said slope section.

24. The resin sheet for a circuit board as claimed in claim 23, wherein a parting layer is disposed between said passivation layer and said resin layer.

25. The resin sheet for a circuit board as claimed in claim 24, wherein a part including an area facing said slope section in said parting layer is roughened.

26. The resin sheet for a circuit board as claimed in claim 24, wherein an area facing said slope section have an area where said parting layer is absent.

27. The resin sheet for a circuit board as claimed in claim 23, wherein the surface of said passivation layer where said resin layer is laminated is release-treated.

28. The resin sheet for a circuit board as claimed in claim 27, wherein a part of said surface of said release-treated passivation layer including an area facing said slope section is roughened.

29. The resin sheet for a circuit board as claimed in claim 27, wherein an area facing said slope section includes an untreated area which is not release-treated.

30. The resin sheet for a circuit board as claimed in claim 21, wherein a release layer is laminated on the other surface of said resin layer.

31. The resin sheet for a circuit board as claimed in claim 21, wherein said resin layer contains an inorganic filler.

32. A long resin sheet for a circuit board comprising a resin layer and a passivation layer laminated on one surface of said resin layer,
wherein in a laminate cross-sectional view in a width direction, at least one edge in said passivation layer extends outward from the edge of said resin layer;
said resin layer comprises a flat section and a bank positioned outside of the flat section;
the thickness of the top of said bank is larger than the thickness of the flat section and said bank has a slope section where the thickness of said resin layer gradually reduces toward the outside of the edge from the top of said bank;
a difference between the resin thickness (d) of the top of said bank and an average thickness (D) of said flat section is 5% or less of said average thickness (D); and
said resin layer contains a cyanate resin.

33. The resin sheet for a circuit board as claimed in claim 32, wherein relationship between a length of said slope section (L) and said average thickness of said flat section (D) is represented by $L \div D \leqq 5$.

34. The resin sheet for a circuit board as claimed in claim 32, wherein adhesiveness of said resin layer to said passivation layer is higher in said flat section than in said slope section.

35. The resin sheet for a circuit board as claimed in claim 34, wherein a parting layer is disposed between said passivation layer and said resin layer.

36. The resin sheet for a circuit board as claimed in claim 35, wherein a part including an area facing said slope section in said parting layer is roughened.

37. The resin sheet for a circuit board as claimed in claim 35, wherein an area facing said slope section have an area where said parting layer is absent.

38. The resin sheet for a circuit board as claimed in claim 34, wherein the surface of said passivation layer where said resin layer is laminated is release-treated.

39. The resin sheet for a circuit board as claimed in claim 38, wherein a part of said surface of said release-treated passivation layer including an area facing said slope section is roughened.

40. The resin sheet for a circuit board as claimed in claim 38, wherein an area facing said slope section includes an untreated area which is not release-treated.

* * * * *